United States Patent
Yu et al.

(10) Patent No.: US 11,996,383 B2
(45) Date of Patent: May 28, 2024

(54) BONDED SEMICONDUCTOR DEVICES AND METHODS OF FORMING THE SAME

(71) Applicant: Taiwan Semiconductor Manufacturing Co., Ltd., Hsinchu (TW)

(72) Inventors: Chen-Hua Yu, Hsinchu (TW); Tung-Liang Shao, Hsinchu (TW); Chih-Hang Tung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/728,024

(22) Filed: Apr. 25, 2022

(65) Prior Publication Data
US 2022/0246574 A1 Aug. 4, 2022

Related U.S. Application Data

(60) Continuation of application No. 16/983,178, filed on Aug. 3, 2020, now Pat. No. 11,315,900, which is a
(Continued)

(51) Int. Cl.
| | |
|---|---|
| *H01L 25/065* | (2023.01) |
| *H01L 23/00* | (2006.01) |
| *H01L 25/075* | (2006.01) |

(52) U.S. Cl.
CPC ............ *H01L 24/73* (2013.01); *H01L 24/06* (2013.01); *H01L 24/16* (2013.01); *H01L 24/32* (2013.01);
(Continued)

(58) Field of Classification Search
CPC ............ H01L 25/0657; H01L 25/0756; H01L 2224/73253; H01L 2224/0345; H01L 2224/03462; H01L 2224/03464; H01L 2224/0347; H01L 2224/03612; H01L 2224/03614; H01L 24/73; H01L 24/06;
(Continued)

(56) References Cited

U.S. PATENT DOCUMENTS

| | | | |
|---|---|---|---|
| 6,015,505 A | 1/2000 | David et al. | |
| 6,835,589 B2 | 12/2004 | Pogge et al. | |

(Continued)

FOREIGN PATENT DOCUMENTS

| | | |
|---|---|---|
| CN | 1221808 A | 7/1999 |
| CN | 102222629 A | 10/2011 |

(Continued)

*Primary Examiner* — Galina G Yushina
(74) *Attorney, Agent, or Firm* — Slater Matsil, LLP

(57) ABSTRACT

A method includes patterning a cavity through a first passivation layer of a first package component, the first package component comprising a first semiconductor substrate and bonding the first package component to a second package component. The second package component comprises a second semiconductor substrate and a second passivation layer. Bonding the first package component to the second package component comprises directly bonding the first passivation layer to the second passivation layer; and reflowing a solder region of a conductive connector disposed in the cavity to electrically connect the first package component to the second package component.

20 Claims, 14 Drawing Sheets

Related U.S. Application Data division of application No. 16/138,166, filed on Sep. 21, 2018, now Pat. No. 10,734,348.

(52) U.S. Cl.
CPC .............. H01L 24/49 (2013.01); H01L 24/81 (2013.01); H01L 24/83 (2013.01); H01L 25/0657 (2013.01); H01L 25/0756 (2013.01); H01L 2224/73253 (2013.01)

(58) Field of Classification Search
CPC ......... H01L 24/16; H01L 24/32; H01L 24/49; H01L 24/81; H01L 24/83; H01L 23/00
See application file for complete search history.

(56) References Cited

U.S. PATENT DOCUMENTS

| | | | |
|---|---|---|---|
| 7,354,798 | B2 | 4/2008 | Pogge et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,598,772 | B2 | 3/2017 | Lin et al. |
| 9,666,502 | B2 | 5/2017 | Chen et al. |
| 9,666,573 | B1 | 5/2017 | Sukekawa |
| 9,735,131 | B2 | 8/2017 | Su et al. |
| 9,831,202 | B2 | 11/2017 | Seo et al. |
| 9,984,986 | B1 | 5/2018 | Huang |
| 2003/0219966 | A1* | 11/2003 | Jin .......................... H01L 24/13 257/E23.021 |
| 2005/0090089 | A1* | 4/2005 | Ma .......................... H01L 24/05 257/E23.021 |
| 2005/0266670 | A1* | 12/2005 | Lin .......................... H01L 24/94 257/E21.705 |
| 2008/0083986 | A1* | 4/2008 | Curtis ..................... C22C 13/00 257/E23.141 |
| 2008/0157362 | A1 | 7/2008 | Chang et al. |
| 2008/0315385 | A1 | 12/2008 | Gerber et al. |
| 2009/0197390 | A1 | 8/2009 | Rothwell et al. |
| 2011/0123856 | A1* | 5/2011 | Dai ..................... H01M 50/528 429/179 |
| 2011/0186995 | A1* | 8/2011 | Alvarado ................ H01L 24/05 257/737 |
| 2011/0240617 | A1* | 10/2011 | Xu .......................... B23K 26/38 219/121.72 |
| 2011/0278740 | A1 | 11/2011 | Chen et al. |
| 2014/0346672 | A1 | 11/2014 | Lin et al. |
| 2015/0243611 | A1* | 8/2015 | Liu .......................... H01L 24/80 438/653 |
| 2016/0172325 | A1 | 6/2016 | Nicolas et al. |
| 2017/0084561 | A1* | 3/2017 | Seo .......................... H01L 24/05 |
| 2017/0125369 | A1* | 5/2017 | Jeong ..................... H01L 24/02 |
| 2018/0102465 | A1 | 4/2018 | Wang |
| 2018/0104445 | A1* | 4/2018 | Fuller ............... A61M 25/0014 |
| 2020/0365550 | A1 | 11/2020 | Yu et al. |

FOREIGN PATENT DOCUMENTS

| | | |
|---|---|---|
| CN | 106548997 A | 3/2017 |
| KR | 20050038501 A | 4/2005 |
| KR | 20170103501 A | 9/2017 |
| KR | 20200035193 A | 4/2020 |
| TW | 201205750 | 2/2012 |

* cited by examiner

|  | Die 700A | | Die 700B | | Die 700C | | Die 700D | | Die 700E | |
|---|---|---|---|---|---|---|---|---|---|---|
|  | Front Side | Back Side | Front Side | Back Side | Front Side | Back Side | Front Side | Back Side | Front Side | Back Side |
| Embodiment 802 | μbump | Cavity | Bump | Bump | Cavity | Bump | Cavity | Bump | Cavity | None |
| Embodiment 804 | μbump | Cavity | Bump | Cavity | Bump | Cavity | Bump | Cavity | Bump | None |
| Embodiment 806 | μbump | Bump | Cavity | Bump | Cavity | Bump | Cavity | Bump | Cavity | None |
| Embodiment 808 | μbump | Bump | Cavity | Cavity | Bump | Cavity | Bump | Cavity | Bump | None |

FIG. 6

BONDED SEMICONDUCTOR DEVICES AND METHODS OF FORMING THE SAME

PRIORITY CLAIM AND CROSS-REFERENCE

This patent application is a continuation of U.S. patent application Ser. No. 16/983,178, filed on Aug. 3, 2020, which is a divisional of U.S. patent application Ser. No. 16/138,166, filed on Sep. 21, 2018, and entitled "Bonded Semiconductor Devices and Methods of Forming the Same," now U.S. Pat. No. 10,734,348, issued on Aug. 4, 2020, which applications are hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates a table of possible semiconductor package configurations according to some embodiments.

DETAILED DESCRIPTION

Figure 1A:
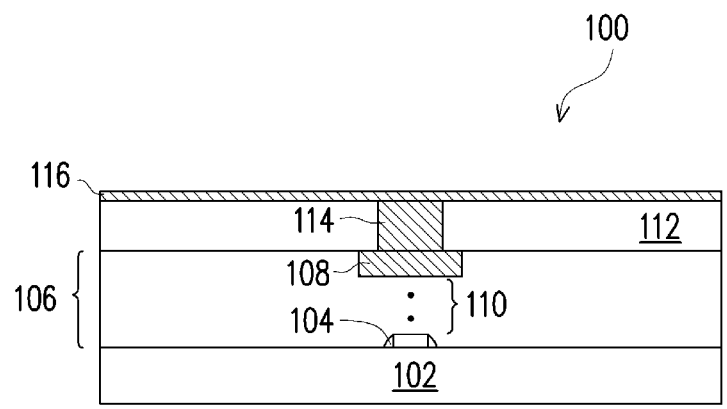
FIGS. 1A through 1H illustrate cross-sectional views of various intermediary steps of manufacturing a semiconductor package according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein relate to bond structures for packaged devices. In various embodiments, two or more chips (sometimes referred to as dies) are bonded together using a combination of dielectric-to-dielectric bonding and conductor-to-conductor bonding. This combination of dielectric and conductor bonding may be referred to as hybrid bonding. By employing a hybrid bonding method, a profile of the bonded package may be reduced as the size (e.g., height) of chip connectors are reduced and no underfill needs to be dispensed between the chips after bonding. The omission of an underfill between the chips further allows for lower resistance and lower parasitic capacitance in the bonded package, which improves electrical performance.

The dielectric-to-dielectric bonding involves bonding a first dielectric layer of a first chip directly to a second dielectric layer of a second chip, and the conductor-to-conductor bonding involves bonding a first conductive feature of the first chip to a second conductive feature of the second chip. At least one of the first conductive feature or the second conductive feature includes a solder region, which is used to form the conductor-to-conductor bond. Because solder has a relatively low reflow temperature, the conductor-to-conductor bond may be formed at a relatively low temperature, which reduces the risk of damaging any components of the chips. Thus, various embodiments provide mechanisms for bonding chips at relatively low temperature while still providing a low profile for improved reliability and electrical performance.

Figure 1B:
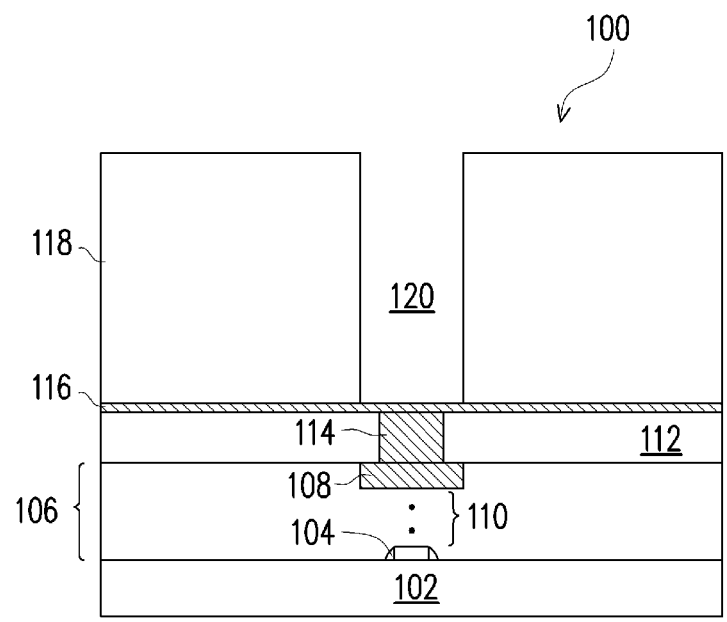
Figure 1C:
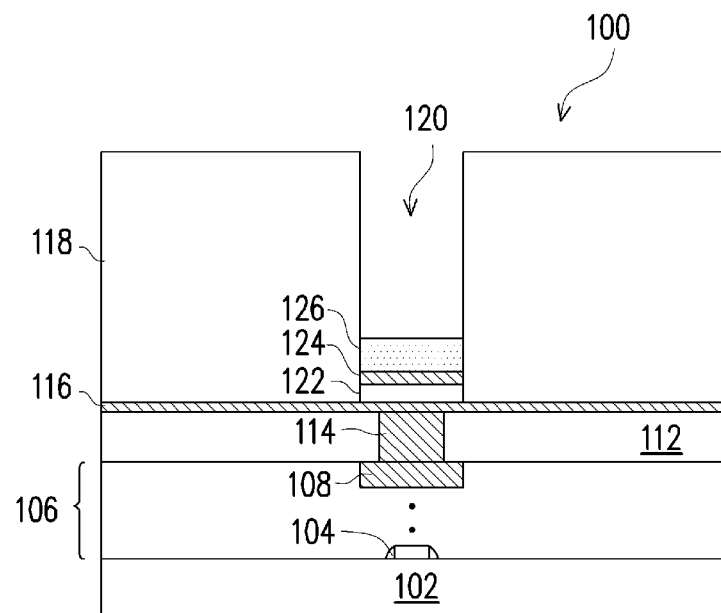
Figure 1D:
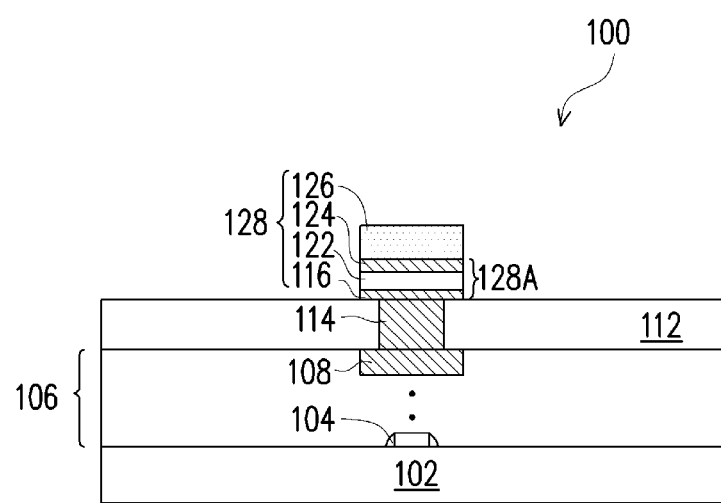
Figure 1E:
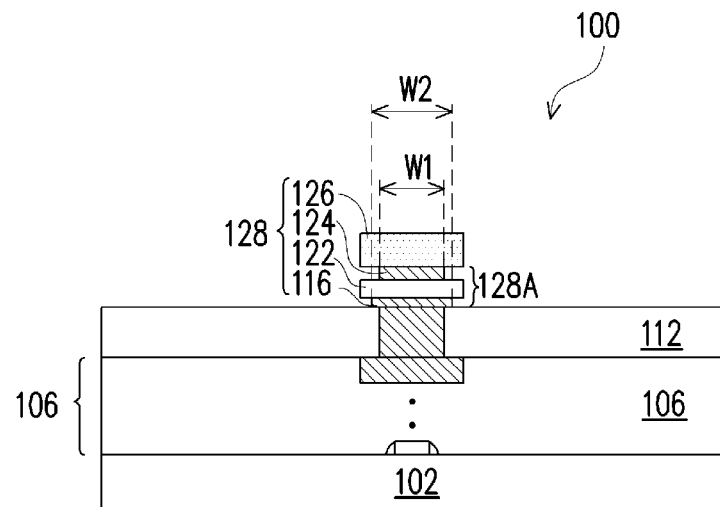
Figure 1F:
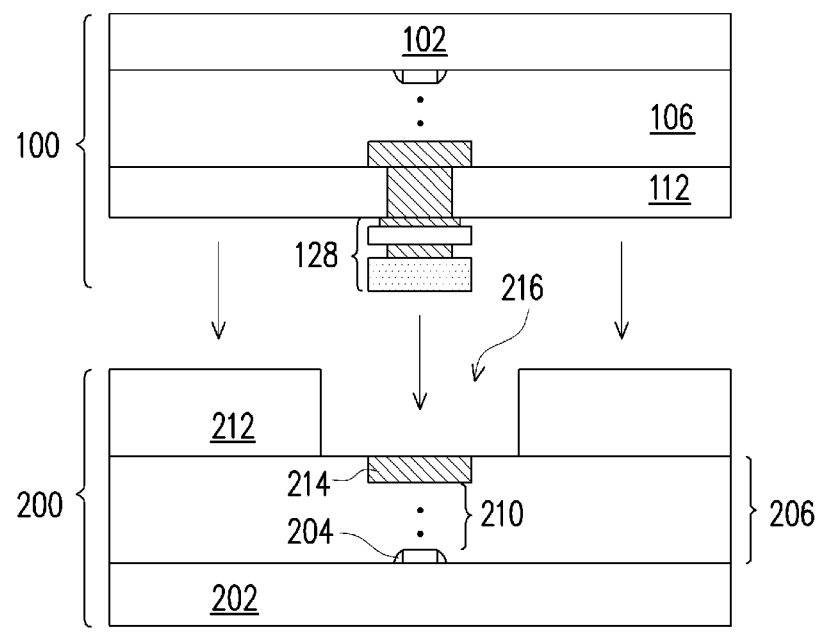
Figure 1G:
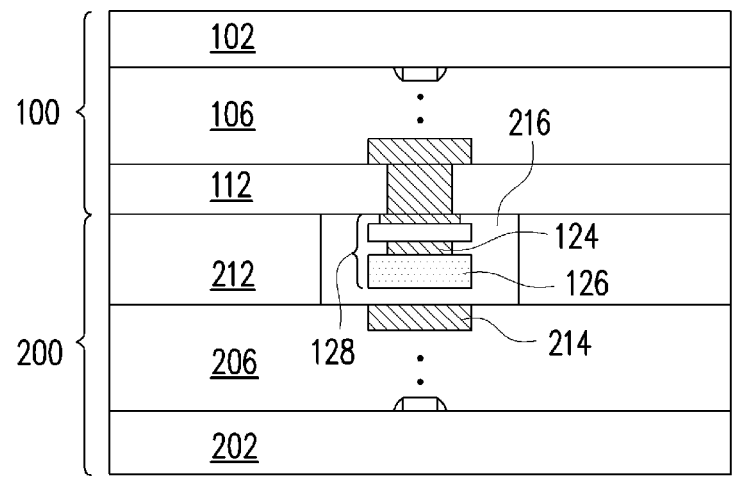
Figure 1H:
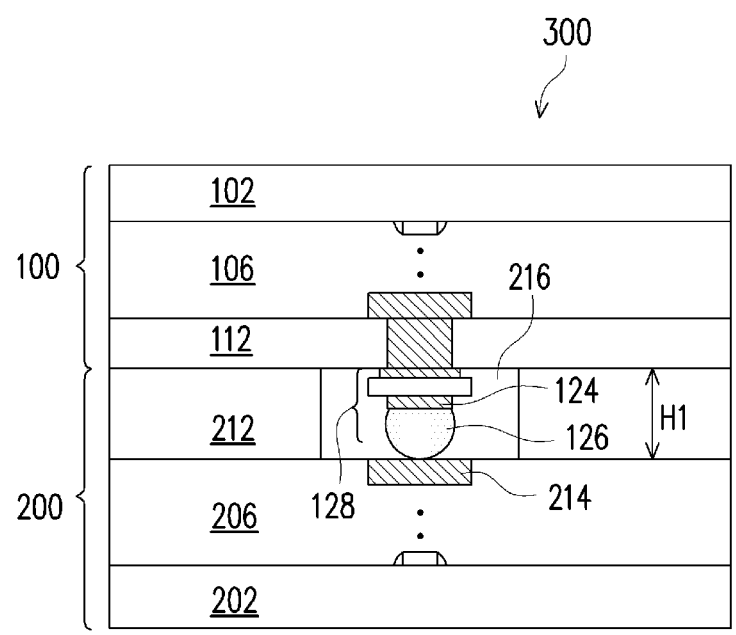

FIGS. 1A through 1H are various cross-sectional views of intermediate steps during a process for forming a semiconductor package 300 by bonding a first package component to a second package component in accordance with some embodiments. In FIGS. 1A through 1E, a first package component (e.g., semiconductor die 100) comprising a die connector 128 (see FIG. 1E) is formed. The die connector 128 may be referred to as a convex die connector because it extends away from an outmost passivation layer 112 of the first semiconductor die 100. FIGS. 1F through 1H illustrate a subsequent bonding process where the first semiconductor die 100 is bonded to a second package component (e.g., second semiconductor die 200) to form a bonded semiconductor package 300. The die connector 128 of the first semiconductor die 100 is bonded to a die connector (e.g., bond pad 308) of the second semiconductor die 200. The die connector of the second semiconductor die 200 may be referred to as a concave die connector because it is disposed within an opening in an outermost passivation layer 212 of the second semiconductor die 200. By using the bonding configurations according to various embodiments, a lower profile package can be provided with increased reliability and improved electrical performance.

Although the dies 100 and 200 are referred to as "dies" herein, it should be understood that the dies 100 and 200 may be formed as part of a larger wafer (e.g., connected to other dies). Subsequently, the dies 100 and 200 may be singulated from other features of the wafer. The singulation process for each of the dies 100 or 200 may be performed prior to bonding to form the package 300 or after bonding to form the package 300. For example, various embodiments described herein may be applied to die-to-die bonding, die-to-wafer bonding, or wafer-to-wafer bonding processes.

In FIG. 1A, the first semiconductor die 100 is illustrated. The die 100 may be a bare chip semiconductor die (e.g., unpackaged semiconductor die). For example, the die 100 may be a logic die (e.g., central processing unit, microcontroller, etc.), a memory die (e.g., dynamic random access memory (DRAM) die, hybrid memory cube (HBC), static random access memory (SRAM) die, a wide input/output (wideIO) memory die, magnetoresistive random access memory (mRAM) die, resistive random access memory (rRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a biomedical die, or the like.

The die 100 may be processed according to applicable manufacturing processes to form integrated circuits in the die 100. For example, the die 100 may include a semiconductor substrate 102, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices 104, such as transistors, diodes, capacitors, resistors, etc., may be formed in and/or on the semiconductor substrate 102 and may be interconnected (as indicated by dots 110) by interconnect structure 106 comprising, for example, metallization patterns in one or more dielectric layers on the semiconductor substrate 102. The interconnect structures 106 and the devices 104 form one or more integrated circuits. In FIG. 1A, only a topmost metallization pattern 108 in the die 100 is illustrated. However, it should be appreciated that the interconnect structure 106 may comprise any number of metallization patterns disposed in any number of dielectric layers.

The die 100 further comprises pads, such as pad 114, to which external connections are made to the interconnect structure 106 and the devices 104. The pad 114 may comprise copper, aluminum, or another conductive material. The pad 114 is disposed on what may be referred to as an active side or front side of the integrated circuit die 100. The active side and front side of the integrated circuit die 100 may refer to a side of the semiconductor substrate 102 on which active devices (e.g., devices 104) are formed. The back side of the integrated circuit die 100 may refer to a side of the semiconductor substrate opposite the active side/front side.

A passivation film 112 is disposed on the interconnect structure 106, and the pad 114 is exposed at a top surface of the passivation film 112. The passivation film 112 may comprise any suitable dielectric material that can be directly bonded to another dielectric layer in a subsequent process step. For example, the passivation film 112 may comprise silicon oxide (e.g., $SiO_2$), silicon oxynitride, silicon nitride, or the like.

In alternative embodiments, the die 100 is an interposer wafer, which is free from active devices therein. The die 100 may or may not include passive devices (not shown) such as resistors, capacitors, inductors, transformers, and the like in accordance with some embodiments.

In yet alternative embodiments, the die 100 is a package substrate strip. In some embodiments, the die 100 includes laminate package substrates, wherein pads 114 (which are schematically illustrated) are embedded in laminate dielectric layers (passivation layer 112). In alternative embodiments, the die 100 is a build-up package substrate, which comprise cores (not shown) and conductive traces (represented by 114) built on the opposite sides of the cores.

As further illustrated in FIG. 1A, a seed layer 116 is deposited over the passivation film 112 and the pad 114 (sometimes referred to as bump metal (BPM) 114). In some embodiments, the seed layer 116 is a metal layer, which may be a single layer or a composite layer comprising a plurality of sub-layers formed of different materials. In some embodiments, the seed layer 116 comprises a titanium layer and a copper layer over the titanium layer. The seed layer 116 may be formed using, for example, PVD or the like.

In FIG. 1B, a photo resist 118 is formed and patterned on the seed layer 116. The photo resist 118 may be formed by spin coating or the like and may be exposed to light for patterning. Although a single photo resist layer is illustrated, the photo resist 118 may include one or more layers of photosensitive material in combination with a backside anti-reflective coating (BARC) layer, a hard mask layer, or the like. The pattern of the photo resist 118 corresponds to subsequently formed die connectors 128 (see FIG. 1D). The patterning forms openings 120 through the photo resist 118 to expose the seed layer 116.

In FIG. 1C, conductive materials are formed in the openings 120 of the photo resist 118 and on the exposed portions of the seed layer 116. The conductive materials may include an optional layer 122, a layer 124 on the layer 122, and a solder layer 126 on the layer 124. In an embodiment, the layer 122 comprises nickel, and the layer 124 comprises copper. Other materials are also possible for the layers 122 and/or 124. For example, the layer 124 may comprise nickel, gold, or any other conductive compound, which can react with solder to form an intermetallic compound (IMC) after reflow. Each of the conductive materials (e.g., the layer 122, the layer 124, and the solder layer 126) may be formed by plating, such as electroplating or electroless plating, or the like.

Then, in FIG. 1D, the photo resist 118 and portions of the seed layer 116 on which the conductive material (e.g., the optional layer 122, the layer 124, and the solder layer 126) is not formed are removed. The photo resist 118 may be removed by an acceptable ashing or stripping process, such as using an oxygen plasma or the like. Once the photo resist 118 is removed, exposed portions of the seed layer 116 are removed, such as by using an acceptable etching process, such as by wet or dry etching. The remaining portions of the seed layer 116 and conductive material (e.g., the optional layer 122, the layer 124, and the layer 126) form the die connectors 128.

The die connectors 128 include an underbump metallurgy (UBM) 128A and a solder layer 126 on the UBM 128A. The UBM 128A includes remaining portions of the seed layer 116, the optional layer 122, and the layer 124. The solder layer 126 may have any suitable material composition capable of being reflowed a relatively low temperature (e.g., less than 300° C., such as about 160° C. to about 260° C.). For example, the solder layer 126 may be an alloy comprising copper, tin, silver, indium, combinations thereof, or the like. The reflow temperature of solder is relatively low compared to the annealing temperature (e.g., 300° C. or greater) used to bond other conductive materials (e.g., copper). It has been observed that this relatively low reflow temperature allows the die 100 to be bonded in subsequent process steps at a relatively low temperature, which advantageously reduces the risk of damage to internal features (e.g., devices 104) of the die 100.

FIG. 1E illustrates the optional etching of the UBM 128A of the die connector 128 in a subsequent process step. The UBM 128A may be etched to reduce a surface area of the UBM 128A at an interface between the UBM 128A and the solder layer 126. During reflow, the solder layer 126 may bead up on the top surface of the UBM 128A due to surface tension. By reducing this surface area, a vertical distance traversed by the solder layer 126 during reflow can be advantageously increased. For example, the solder layer 126 can form a bead with a greater height during reflow when the surface area at the interface is smaller. For example, it has been observed that a vertical height of the solder layer 126 increases by about 50% to about 60% when the surface area is reduced compared to a vertical height of the solder layer 126 increasing by about 40% without reducing the surface area. The increased vertical height of solder layer 126 results in a greater volume of the solder layer 126 flowing away from the UBM 128A, which improves an electrical connection provided by the solder layer 126 in the bonded structure.

The UBM 128A may be etched using, for example, a wet etch that etches the layer 124 immediately underlying the solder layer 126. In an embodiment, the wet etch is a selective wet etch that etches the layer 124 faster than the optional layer 122. For example, for the UBM configuration illustrated in FIG. 4D, hydrogen chloride (HCl) may be used to etch the layer 124.

Further because the seed layer 116 is formed using a different process than the layer 124, the seed layer 116 may be etched at a lower rate than the layer 124 using a same etch process even when the seed layer 116 and the layer 124 comprise the same material(s). For example, an HCl wet etch may selectively etched a sputtered layer comprising copper (the seed layer 116) at a lower rate than a plated layer comprising copper (e.g., the layer 124). After etching, a width W1 of the layer 124 may be in the range of about 2 μm to about 20 μm and may be less than a width W2 of the seed layer 116. The width W2 of seed layer 116 may be in the range of about 3 μm to about 30 μm. In this manner, the seed layer 116 and the layer 124 may comprise the same material(s), but the layer 124 may be etched without excessively etching the seed layer 116. If the seed layer 116 is excessively etched, an adhesion between the die connector 128 and underlying features may be inadvertently reduced, causing manufacturing defects.

In FIG. 1F, the die 100 is aligned with a die 200. The die 200 may also be selected from a device die, an interposer die, a package substrate, and the like. In some embodiments, the die 200 may be aligned with the die 100 as a component of a wafer (e.g., prior to singulation from other dies in the wafer). In other embodiments, the die 200 may be aligned with the die 100 after singulation. The die 200 includes substrate 202, devices 204, interconnect structures 206 (comprising contact pad 214) connected to the devices 204 (as indicated by dots 210), and passivation layer 212. The die 200 may have a structure similar to what is described for the die 100, and the details are not repeated herein. The materials of the features in the die 200 may be found by referring to the like features in the die 100, with the like features in the die 100 starting with number "1," which features correspond to the features in the die 200 and having reference numerals starting with number "2." In the die 200, the contact pad 214 is exposed by openings 216, which extend through the passivation layer 212. The die 100 is aligned with the die 200 in manner that each die connector 128 is aligned with an opening 216, which exposes a portion of the pad 214.

In FIG. 1G, the passivation layer 112 of the die 100 is physically contacted and bonded to the passivation layer 212 of the die 200. Prior to bonding, at least one of the passivation layers 112 or 212 may be subjected to a surface treatment. The surface treatment may be a plasma treatment. The plasma treatment may be performed in a vacuum environment. The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the surface treatment, the number of OH groups at the surface of passivation layers 112 and/or 212 increases, which is beneficial for forming strong fusion bonds. The plasma treatment may also be performed using pure or substantially pure $H_2$, Ar, or $N_2$ as the process gas, which treats the surfaces of the passivation layer 112 and/or the passivation layer 212 through reduction and/or bombardment. After surface treatment, a cleaning process (e.g., a rinse with deionized water) may be applied to the passivation layer 112 and/or the passivation layer 212.

After cleaning, the dies 100 and 200 are pressed against each other. A pre-bonding pressing force may be applied to press the dies 100 and 200 against each other. The pressing force may be lower than about 5 Newtons per die in some exemplary embodiments, although a greater or smaller force may also be used. The pre-bonding may be performed at room temperature (between about 21° C. and about 25° C.), although higher temperatures may be used. The bonding time may be shorter than about 1 minute, for example.

After the pre-bonding, the passivation layers 112 and 212 are bonded to each other. The bond, however, needs to be strengthened in a subsequent annealing step. For example, an optional annealing at a temperature of about 170° C. for about 1 hour may be performed on the dies 100 and 200. The optional anneal process may be separate from the reflow process discussed below with respect to FIG. 1H. For example, the dies 100 and 200 may be annealed, and then the solder layer 126 may be subsequently reflowed. Alternatively, the optional annealing may be omitted, and the bond between the passivation layers 112 and 212 may be strengthened concurrently with reflowing the solder layer 126. When the temperature rises, the OH bonds in passivation layers 112 and 212 break to form strong Si—O—Si bonds, and hence the dies 100 and 200 are bonded to each other through fusion bonds. The annealing temperature may be lower than a reflow temperature of solder. For example, after bonding the passivation layers 112 and 212, the die connector 128 may remain unbonded to the contact pad 214. As a result, a height of the die connector 128 may be less than a height (e.g., thickness) of the passivation layer 212, and a gap may be disposed between the die connector 128 and the contact pad 214.

In FIG. 1H, a reflow is performed on the die connector 128 to reflow the solder layer 126. Reflowing the solder layer 126 physically and electrically bonds the die connector 128 to the contact pad 214 of the die 200. Hence, the resulting bonds between the dies 100 and 200 are hybrid bonds, and a package 300 is provided by bonding the dies 100 and 200. As a result of the reflow, an IMC may be formed around areas where the solder layer 126 interfaces with the die connector 128.

In some embodiments, the die connector 128 is bonded to the contact pad 214 without flux. For example, no flux is formed on the contact pad 214 prior to bonding, which advantageously allows for fine pitched bonding of two or more chips. Various embodiments allow for a flux-less bonding process to be used, which allows for fine pitched bonding of two or more chips. As flux can affect the surface tension and height of the bead formed of the solder layer 126 during reflow, flux-less bonding may allow for a more uniform and predictable manufacturing process. Although the illustrated embodiment describes a flux-less bonding process, in other embodiments, flux may be used as part of the bonding process.

Because a reflow temperature of solder is lower than an anneal temperature required to achieve inter-diffusion of other materials (e.g., metal), a lower temperature anneal can be performed to achieve reflow. For example, reflowing the solder layer can be performed at a temperature less than 300° C., such as about 250° C. to about 260° C. for a duration of 1 minute to 2 minutes. The lower annealing temperature allows for fewer manufacturing defects, particularly when the dies 100 and/or 200 are temperature sensitive (e.g., particularly in memory dies, biomedical dies, etc.). As a result of the reflow, a height H1 of the die connector 128 may be increased, for example, to match a height H1 (e.g., thickness) of the passivation layer 212. In some embodiments, the height H1 may be 5 μm or less.

In package 300, the die connector 128 may be referred to as a convex die connector because it extends away from an outmost passivation layer (e.g., 112) of the die 100. Further, the contact pad 214 may be referred to as a concave die connector because it is exposed through the opening 216 in an outmost passivation layer (e.g., 212) of the die 200. In package 300, the die connector 128 is disposed in the opening 216. After bonding, portions of the opening 216 around the die connector 128 may remain unfilled and be an air gap. Thus, thickness of the bonded package 300 may be reduced because all or a portion of the die connector 128 is embedded within the passivation layer 212 of the die 200.

Further, the passivation layer 212 may be used as a solder mask and physical support between the dies 100 and 200. As such, an underfill need not be dispensed between the dies 100 and 200, for example, around the die connector 128. By omitting an underfill, parasitic capacitance and resistance can be reduced between the die 100 and the die 200.

Figure 2A:
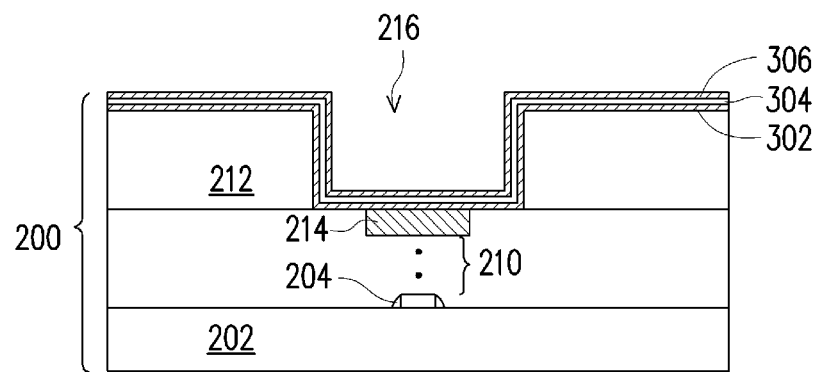
FIGS. 2A through 2C illustrate cross-sectional views of various intermediary steps of manufacturing a semiconductor package according to some embodiments.
Figure 2B:
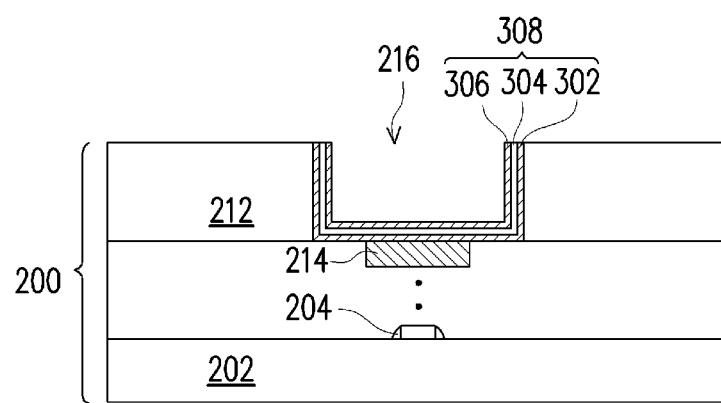
Figure 2C:
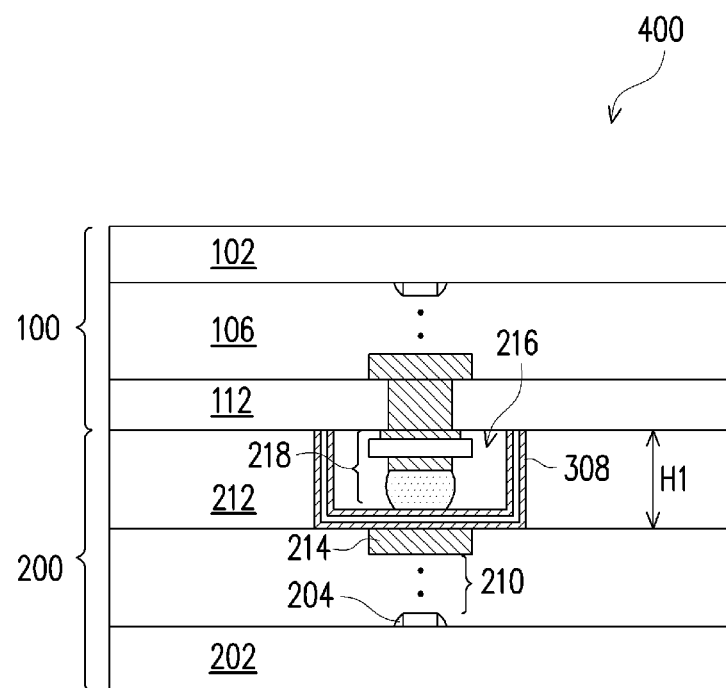

FIGS. 2A through 2C illustrate cross-sectional views of intermediary process steps of forming a bonded package 400 according some embodiments. In FIGS. 2A through 2C, a first package component (e.g., die 100) is bonded to a second package component (e.g., die 200). Die 100 and die 200 may be similar to the features discussed above with respect to FIGS. 1A through 1H where like reference numerals indicate like features formed using like processes. Further description of these features is omitted for brevity.

As discussed above, the die 200 comprises a contact pad 214, an outermost passivation layer 212, and an opening 216 extending through the passivation layer 212 and exposing the contact pad 214. In FIGS. 2A through 2B, a bond pad 308 (also referred to as contact pad 308) is formed on sidewalls and a bottom surface of the opening 216.

In FIG. 2A, a seed layer 302 is deposited on sidewalls and a bottom surface of the opening 216. In some embodiments, the seed layer 302 is a metal layer, which may be a single layer or a composite layer comprising a plurality of sub-layers formed of different materials. In some embodiments, the seed layer 302 comprises a titanium layer and a copper layer over the titanium layer. The seed layer 302 may be formed using, for example, PVD or the like.

Conductive materials are formed on the seed layer 302. The conductive materials may include an optional layer 304 and a layer 306. In an embodiment, the layer 304 comprises nickel, and the layer 306 comprises copper. Other materials are also possible for the layers 304 and/or 306. Each of the conductive materials (e.g., the layer 304 and layer 306) may be formed by plating, such as electroplating or electroless plating, or the like.

Subsequently, in FIG. 2B, a planarization process (e.g., a chemical mechanical polish (CMP), grinding, etch back, or the like) may be performed on the seed layer 302, the layer 304, and the layer 306 to remove portions of the seed layer 302, the layer 304, and the layer 306 over a top surface of the passivation layer 212. Hence, a bond pad 308 is formed along sidewalls and a bottom surface of the opening 216, which extends through the passivation layer 212. The bond pad 308 may further be physically and electrically connected to the contact pad 214 exposed by the opening 216.

In FIG. 2C, the die 200 is hybrid bonded to the die 100 to form a package 400. Hybrid bonding may include forming a dielectric-to-dielectric bond between the passivation layers 112 and 212 using a similar process as described above with respect to FIG. 1G. Hybrid bonding may further include a reflow process, which bonds a die connector 128 of the die 100 to the bond pad 308 of the die 200. The reflow process may be similar to the process described above with respect to FIG. 1H. For example, a solder layer 126 of the die connector 128 may be reflowed to physically and electrically bond to the bond pad 308 of the die 200.

FIGS. 3A through 3E illustrate cross-sectional views of intermediary process steps of forming a bonded package 500 according some embodiments by bonding a first package component (e.g., die 100) to a second package component (e.g., die 200). Die 100 and die 200 may be similar to the features discussed above with respect to FIGS. 1A through 1H where like reference numerals indicate like features formed using like processes. Further description of these features is omitted for brevity.

As discussed above, the die 200 comprises a contact pad 214, an outermost passivation layer 212, and an opening 216 extending through the passivation layer 212 and exposing the contact pad 214. In FIGS. 3A through 3E, a bond pad 408 (see FIGS. 3C through 3E, also referred to as contact pad 408) is formed on sidewalls and a bottom surface of the opening 216.

Figure 3A:
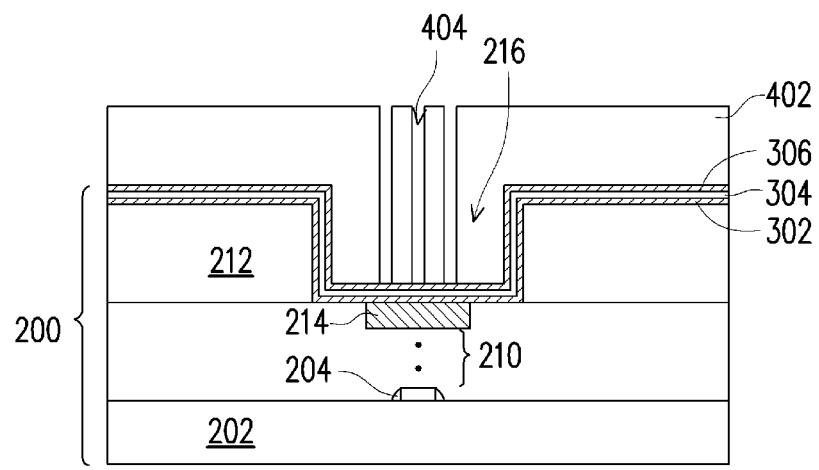
FIGS. 3A through 3E illustrate cross-sectional views of various intermediary steps of manufacturing a semiconductor package according to some embodiments.

In FIG. 3A, a seed layer 302, an optional conductive layer 304, and a conductive layer 306 are sequentially formed on sidewalls and a bottom surface of the opening 216. The seed layer 302, the layer 304, and the layer 306 may be similar to features disclosed in FIG. 2B where like reference numerals indicate like elements formed using like processes.

As further illustrated by FIG. 3A, a photo resist 402 is formed over the layer 306 and extending into the opening

216. The photo resist 402 may be formed by spin coating or the like and may be exposed to light for patterning. Although a single photo resist layer is illustrated, the photo resist 402 may include one or more layers of photosensitive material in combination with a backside anti-reflective coating (BARC) layer, a hard mask layer, or the like. The pattern of the photo resist 402 corresponds to subsequently formed conductive needles (see FIG. 3B). The patterning forms openings 404 through the photo resist 402 to expose the layer 306.

Figure 3B:
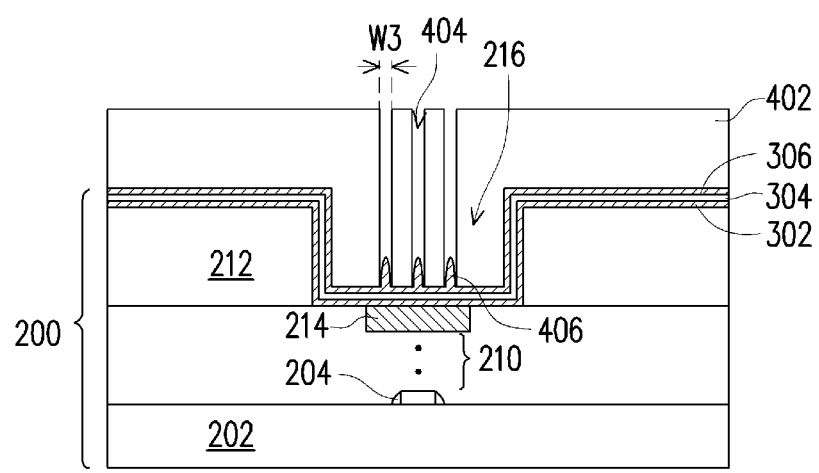

In FIG. 3B, a conductive material is formed in the openings 404 of the photo resist 402 and on the exposed portions of the layer 306. The conductive material may include conductive needles 406. The conductive needles 406 may be referred to as needles because each needle is relatively thin. For example, a width W3 of each of the conductive needles 406 may be in the range of about 0.5 µm to about 5 µm. In some embodiments, the conductive needles 406 comprise copper. Other materials are also possible for the conductive needles 406. For example, the conductive needles 406 may comprise nickel, gold, or any other conductive material, which can react with solder to form an intermetallic compound (IMC) after reflow. The conductive needles 406 may be formed by plating, such as electroplating or electroless plating, or the like. The plating process may use the exposed layer 306 as a seed layer without requiring a separate seed layer. Although three conductive needles 406 are illustrated, any number of conductive needles 406 may be formed on the layer 306.

Figure 3C:
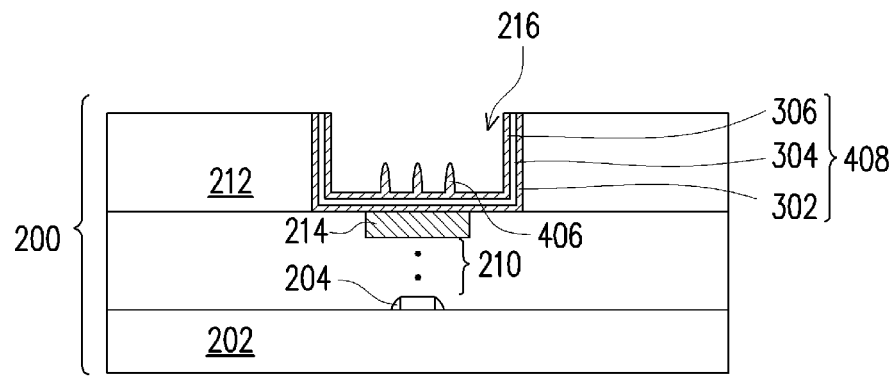

In FIG. 3C, the photo resist 402 is removed. The photo resist 402 may be removed by an acceptable ashing or stripping process, such as using an oxygen plasma or the like. Once the photo resist 402 is removed, a planarization process (e.g., a chemical mechanical polish (CMP), grinding, etch back, or the like) may then be performed on the seed layer 302, the layer 304, and the layer 306 to remove portions of the seed layer 302, the layer 304, and the layer 306 over a top surface of the passivation layer 212. Hence, a bond pad 408 is formed along sidewalls and a bottom surface of the opening 216, which extends through the passivation layer 212. The bond pad 408 may be physically and electrically connected to the contact pad 214 exposed by the opening 216, and the bond pad 408 may further include conductive needles 406 extending upwards (e.g., in a direction away from the substrate 202).

Figure 3D:
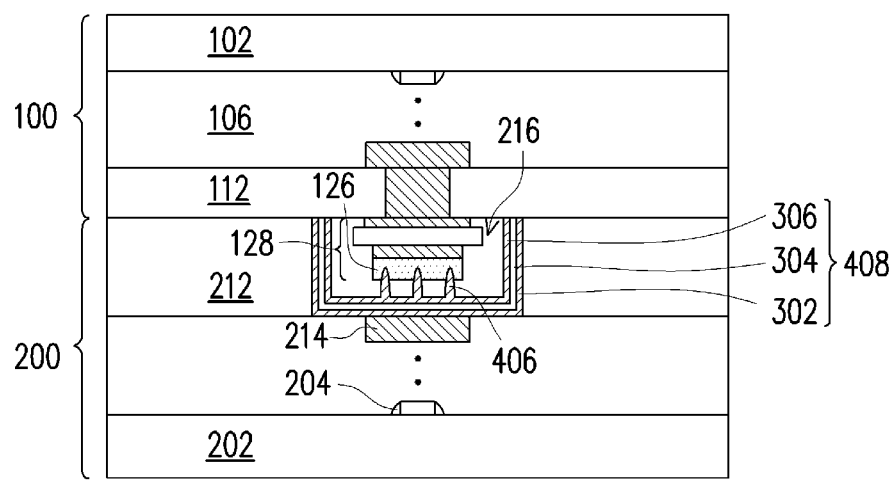

In FIG. 3D, the die 100 and the die 200 are aligned and contacted together. In contacting the dies 100 and 200, upper portions of the conductive needles 406 of the bond pad 408 may be embedded in the die connector 128 of the die 100. For example, upper portions the conductive needles 406 may extend into the solder layer 126 while lower portions of the conductive needles 406 may remain outside of the solder layer 126. Embedding the conductive needles 406 may be a result of a material of the conductive needles 406 being formed of a relatively hard material compared to the solder layer 126. For example, in an embodiment, the conductive needles 406 are copper, and the solder layer is an indium layer. An elastic modulus and hardness of indium is 11 GPa and 0.009 GPa, respectively, while an elastic modulus and hardness of copper is no GPa and 2.15 GPa, respectively. As a result of the relatively hardness of the conductive needles 406, the conductive needles 406 may be at least partially embedded within the solder layer 126.

Figure 3E:
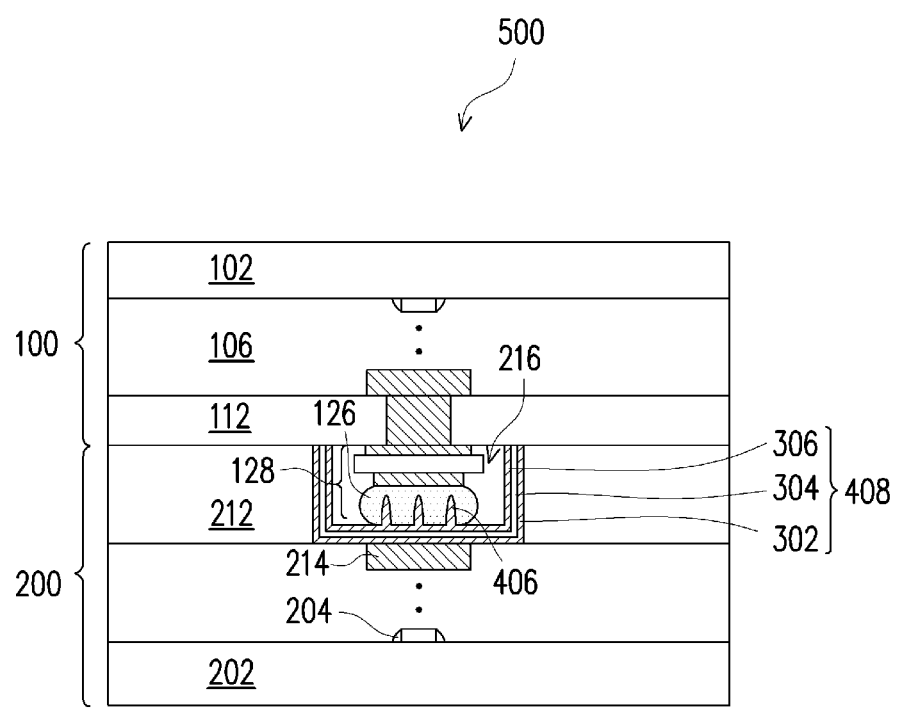

In FIG. 3E, the die 200 is hybrid bonded to the die 100 to form a package 500. Hybrid bonding may include forming a dielectric-to-dielectric bond between the passivation layers 112 and 212 using a similar process as described above with respect to FIG. 1G. After the passivation layers 112 and 212 are bonded, the package 500 may have a similar configuration as illustrated in FIG. 3D. For example, the solder layer 126 may remain physically detached from the layer 306, and upper portions of the conductive needles 406 extend into the solder layer 126 of the die connector 128. Hybrid bonding may further include a reflow process, which bonds a die connector 128 of the die 100 to the bond pad 408 of the die 200. The reflow process may be similar to the process described above with respect to FIG. 1H. For example, a solder layer 126 of the die connector 128 may be reflowed to physically and electrically bond to the bond pad 408 of the die 200. Further, the conductive needles 406 of the bond pad 408 may be embedded within the reflowed solder layer 126 of the die connector 128. As a result of the reflow, an IMC may be formed around areas where the solder layer 126 interfaces with the bond pad 408/conductive needles 406. As a result of embedding the conductive needles 406 in the die connector 128, improved electrical connections can be made between the die 100 and the die 200. Embedding the conductive needles 406 in the die connector 128 partially during bonding may further enlarge a process window for the height of die connector 128 and/or width of the opening 216, which improves ease of manufacturing package 500. As illustrated by FIG. 3E, the middle layer 122 of the die connector 128 is wider than the solder layer 126, such as a widest point of the solder layer 126 is a cross-sectional view.

FIGS. 4A through 4F illustrate cross-sectional views of intermediary process steps of forming a bonded package 600 according some embodiments by bonding a first package component (e.g., die 100) to a second package component (e.g., die 200). Die 100 and die 200 may be similar to the features discussed above with respect to FIGS. 1A through 1H where like reference numerals indicate like features formed using like processes. Further description of these features is omitted for brevity.

As discussed above, the die 200 comprises a contact pad 214, an outermost passivation layer 212, and an opening 216 extending through the passivation layer 212 and exposing the contact pad 214. In FIGS. 4A through 4D, a die connector 514 similar to the die connector 128 is formed on the contact pad 214 in the opening 216. In the embodiments of FIGS. 4A through 4E, the die connector 514 in the opening 216 of the die 200 may replace the die connector 128 of the die 100.

Figure 4A:
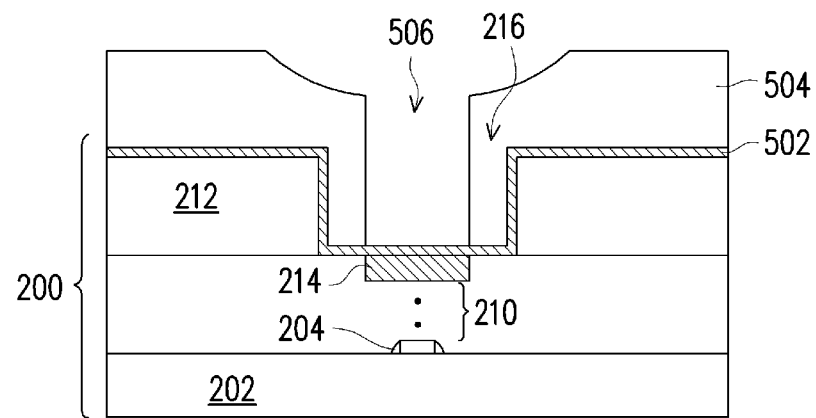
FIGS. 4A through 4F illustrate cross-sectional views of various intermediary steps of manufacturing a semiconductor package according to some embodiments.

In FIG. 4A, a seed layer 502 is formed on sidewalls and a bottom surface of the opening 216. The seed layer 502 may be formed of a similar material and/or process as the seed layer 302 described above with respect to FIG. 2A.

As further illustrated by FIG. 4A, a photo resist 504 is formed over the layer 502 and extending into the opening 216. The photo resist 504 may be formed by spin coating or the like and may be exposed to light for patterning. Although a single photo resist layer is illustrated, the photo resist 504 may include one or more layers of photosensitive material in combination with a backside anti-reflective coating (BARC) layer, a hard mask layer, or the like. The patterning forms openings 506 through the photo resist 504 to expose the seed layer 502.

Figure 4B:
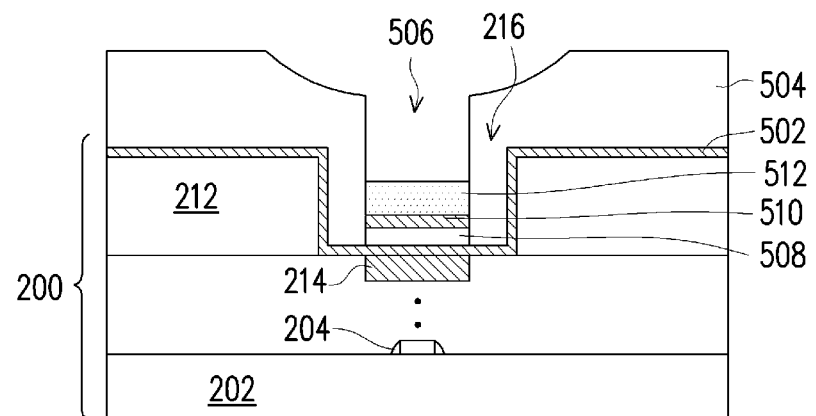

In FIG. 4B, conductive materials are formed in the openings 506 of the photo resist 504 and on the exposed portions of the seed layer 502. The conductive materials may include an optional layer 508, a layer 510 on the layer 508, and a solder layer 512 on the layer 510. The optional layer 508 may be formed of a similar material using a similar process as the layer 122; the layer 510 may be formed of a similar material using a similar process as the layer 124; and the solder layer 512 may be formed of a similar material using a similar process as the solder layer 126 described above with respect to FIG. 1C.

Figure 4C:
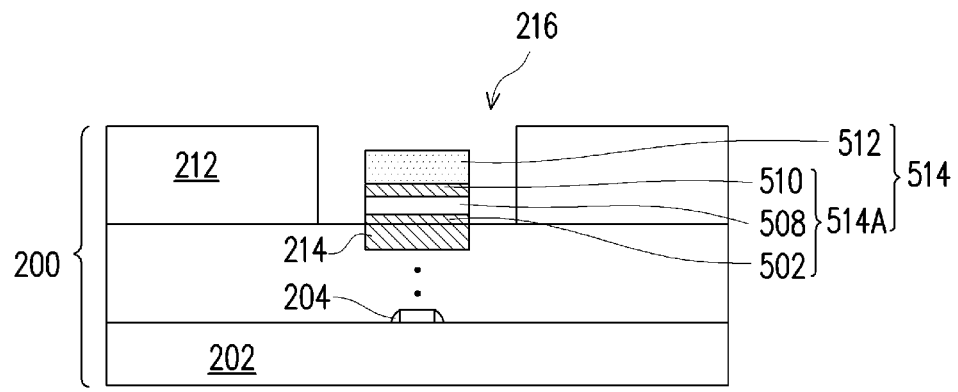

Then, in FIG. 4C, the photo resist 504 and portions of the seed layer 502 on which the conductive material (e.g., the optional layer 508, the layer 510, and the solder layer 512) is not formed are removed. The photo resist 504 may be removed by an acceptable ashing or stripping process, such as using an oxygen plasma or the like. Once the photo resist 504 is removed, exposed portions of the seed layer 502 are removed, such as by using an acceptable etching process, such as by wet or dry etching. The remaining portions of the seed layer 502 and conductive material (e.g., the optional layer 508, the layer 510, and the layer 512) form the die connectors 514. The die connector 514 is disposed in the opening 216 and at least partially extends through the passivation layer 212 of the die 200.

The die connectors 514 include an underbump metallurgy (UBM) 514A and a solder layer 512 on the UBM 514A. The UBM 514A includes remaining portions of the seed layer 502, the optional layer 508, and the layer 510. It has been observed that this relatively low reflow temperature allows the die 200 to be bonded in subsequent process steps at a relatively low temperature, which advantageously reduces the risk of damage to internal features (e.g., devices 104) of the die 200.

Figure 4D:
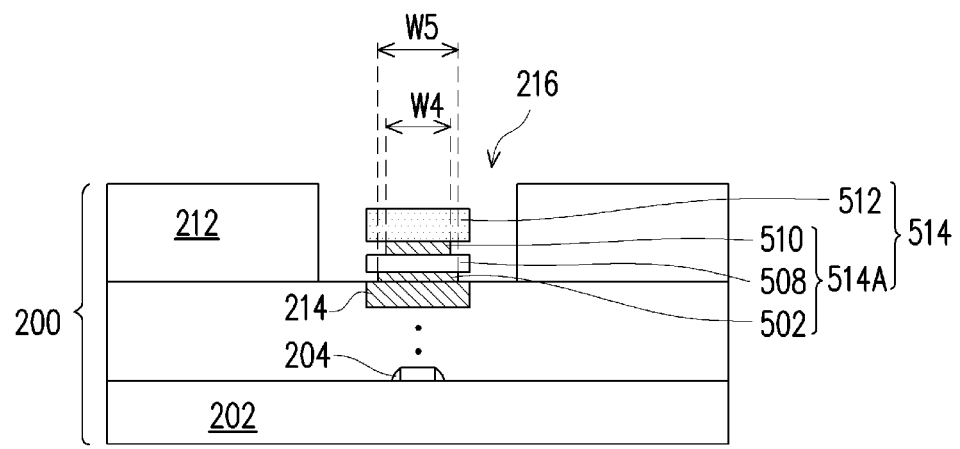

FIG. 4D illustrates the optional etching of the UBM 514A of the die connector 514 in a subsequent process step. The UBM 514A may be etched to reduce a surface area of the UBM 514A at an interface between the UBM 514A and the solder layer 512. By reducing this surface area, a vertical distance traversed by the solder layer 512 during reflow can be advantageously increased as described above with respect to the optional etching of UBM 128A. For example, the solder layer 512 can form a bead with a greater height during reflow when the surface area at the surface area of the UBM 514A is smaller.

The UBM 514A may be etched using, for example, a wet etch that etches the layer 510 immediately underlying the solder layer 512. In an embodiment, the wet etch is a selective wet etch that etches the layer 510 faster than the optional layer 508. For example, for the UBM configuration illustrated in FIG. 1E, hydrogen chloride (HCl) may be used to etch the layer 510.

Further because the seed layer 502 is formed using a different process than the layer 510, the seed layer 502 may be etched at a lower rate than the layer 510 using a same etch process even when the seed layer 502 and the layer 510 comprise the same material(s). For example, an HCl wet etch may selectively etched a sputtered layer comprising copper (the seed layer 502) at a lower rate than a plated layer comprising copper (e.g., the layer 510). After etching, a width W4 of the layer 510 may be in the range of about 1 µm to about 19 µm and may be less than a width W5 of the seed layer 502. The width W5 of seed layer 502 may be in the range of about 1.5 µm to about 20 µm. In this manner, the seed layer 502 and the layer 510 may comprise the same material(s), but the layer 510 may be etched without excessively etching the seed layer 502. If the seed layer 502 is excessively etched, an adhesion between the die connector 514 and underlying features may be inadvertently reduced, causing manufacturing defects.

Figure 4E:
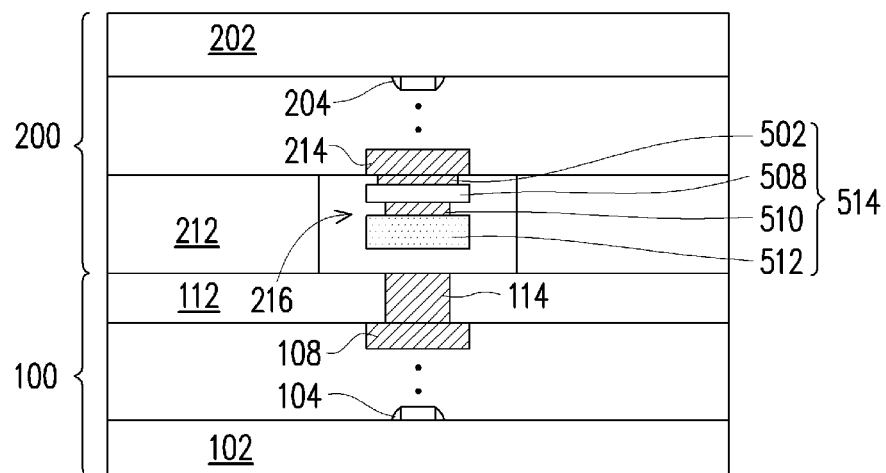

In FIG. 4E, the die 100 and the die 200 are aligned and contacted together. In contacting the dies 100 and 200, the die connector 514 is physically separated from the contact pad 114 of the die 100. For example, a gap may be disposed between the solder layer 512 of the die connector 514 and the contact pad 114 of the die 100.

Figure 4F:
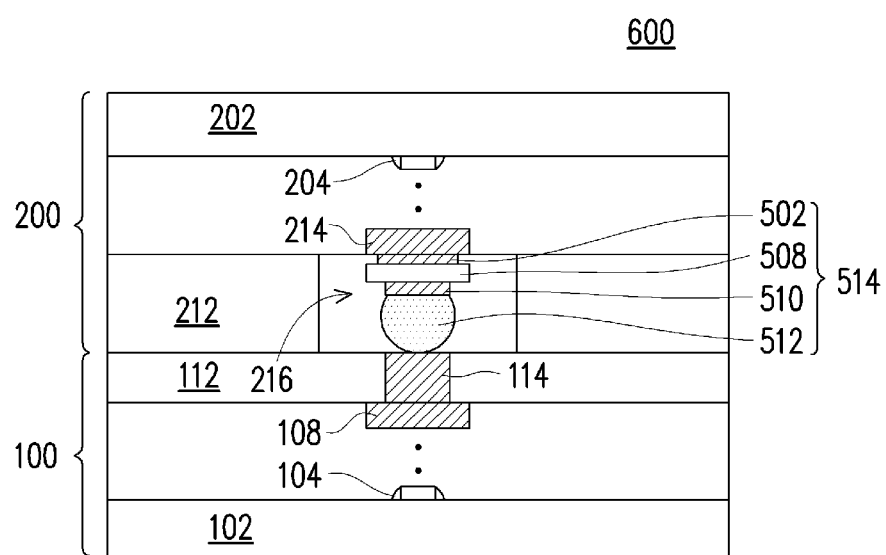

In FIG. 4F, the die 200 is hybrid bonded to the die 100 to form a package 600. Hybrid bonding may include forming a dielectric-to-dielectric bond between the passivation layers 112 and 212 using a similar process as described above with respect to FIG. 1G. After the passivation layers 112 and 212 are bonded, the package 600 may have a similar configuration as illustrated in FIG. 4E. For example, the solder layer 512 may remain physically detached from the contact pad 114

Hybrid bonding may further include a reflow process, which bonds a die connector 514 of the die 200 to the contact pad 114 of the die 100. The reflow process may be similar to the process described above with respect to FIG. 1H. For example, a solder layer 512 of the die connector 514 may be reflowed to physically and electrically bond to the contact pad 114 of the die 100.

Figure 5:
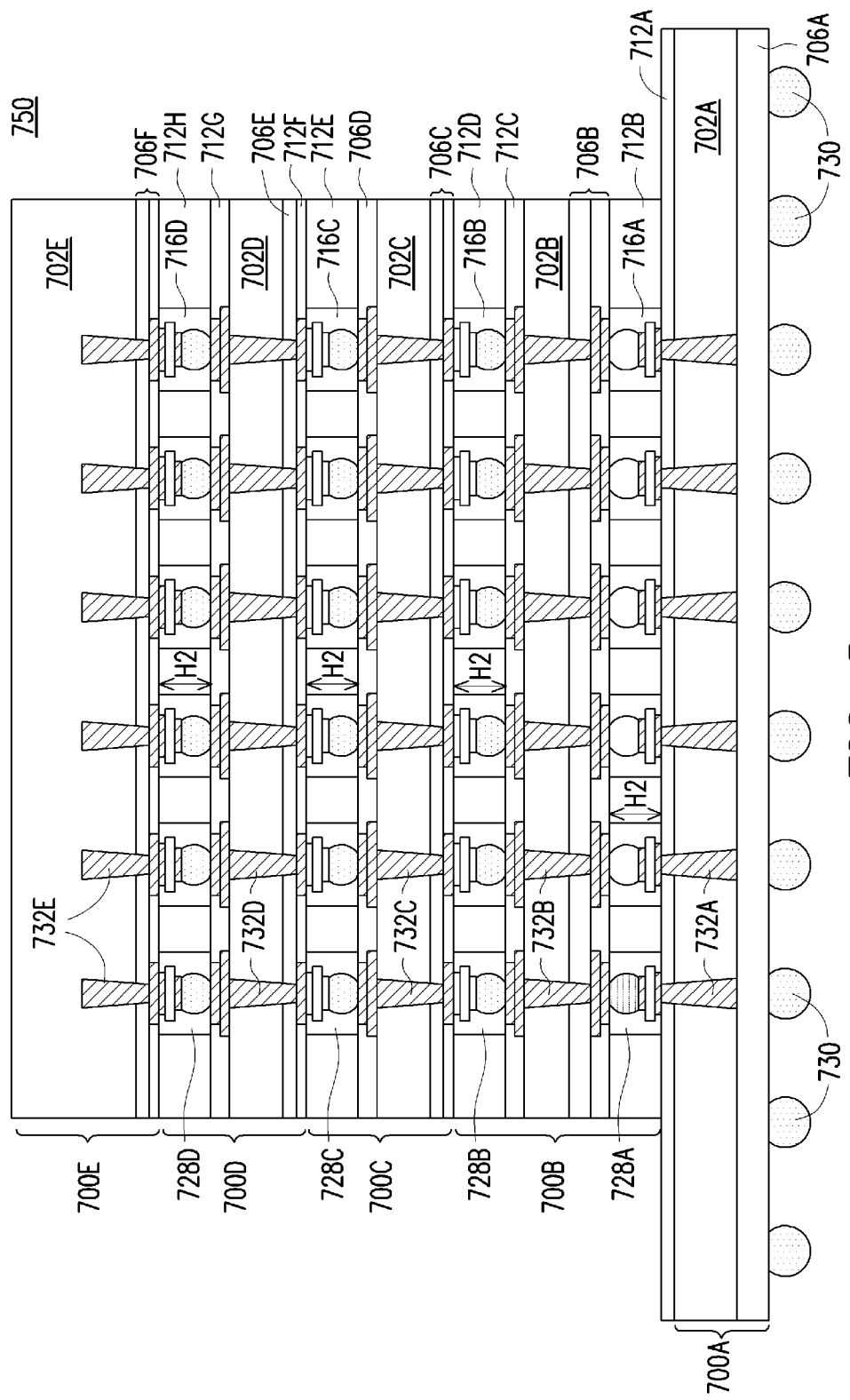
FIG. 5 illustrates a cross-sectional view of a semiconductor package according to some embodiments.

FIG. 5 illustrates a cross-sectional view of a package 750 according to some embodiments. The package 750 includes a first package component (e.g., die 700A (e.g., a logic die)) bonded to multiple other package components (e.g., stacked dies 700B, 700C, 700D, and 700E (e.g., memory dies)) using a bonding configuration similar to those discussed above. The materials of the features and formation methods in the dies 700A, 700B, 700C, 700D, and 700E may be found by referring to the like features in the die 100, with the like features in the die 100 starting with number "1," which features correspond to the features in the die 200 and having reference numerals starting with number "7." For example, each of the dies 700A, 700B, 700C, 700D, and 700E include respective semiconductor substrates 702A, 702B, 702C, 702D, and 702E on which active devices are formed. Interconnect structures 706A, 706B, 706C, 706D, 706E, and 706F include one or more layers of interconnect structures in one or more dielectric layers, which electrically interconnect the active devices of various dies 700A, 700B, 700C, 700D, and 700E to form functional circuits. Each of the dies 700A, 700B, 700C, 700D, and 700E further include a respective plurality of through vias 732A 732B, 732C, 732D, and 732E. Each of the plurality of through vias 732A 732B, 732C, 732D, and 732E provide electrical connection through respective semiconductor substrates 702A, 702B, 702C, 702D, and 702E of the dies 700A, 700B, 700C, 700D, and 700E. A height of each of the dies 700A, 700B, 700C, 700D, and 700E may be about 30 µm or less in some embodiments.

Bonding of the dies 700A, 700B, 700C, 700D, and 700E may use a hybrid bonding configuration as discussed above. For example, passivation layers 712A, 712B, 712C, 712D, 712E, 712F, 712G, and 712H are used to form dielectric-to-dielectric bonds at respective interfaces of the dies 700A, 700B, 700C, 700D, and 700E. Cavities 716A, 716B, 716C, and 716D extend through respective passivation layers 712B, 712D, 712E, and 712H. Die connectors 728A, 728B, 728C, and 728D are disposed in respective cavities 716A, 716B, 716C, and 71D, and the die connectors 728A, 728B, 728C, and 728D provide electrical connection through conductor-to-conductor bonds at respective interfaces of the dies 700A, 700B, 700C, 700D, and 700E. Each of the die connectors 728A, 728B, 728C, and 728D include solder regions, which are reflowed to form the conductor-to-conductor bonds. The die 700A further includes die connectors 730 (e.g., microbumps (pbumps)), which may be used to bond the package 750 to another package component, such as, a substrate, a package substrate, an interposer, a printed circuit board, another package, a motherboard, or the like. The die connectors 730 may be disposed on a front side of the die 700A. Because a hybrid configuration is used, no underfill needs to be dispensed between the dies 700A, 700B, 700C, 700D, and 700E. By omitting an underfill, parasitic capacitance and resistance may be reduced, improving electrical performance. Further, various hybrid bonding configurations allow for lower profile and high density bonding. For example, a standoff height H2 between the dies 700A, 700B, 700C, 700D, and 700E may be about 5 μm or less in some embodiments. The standoff height H2 may be equal to a height of the die connectors 728A, 728B, 728C, and 728D and may further be equal to a height of passivation layers 712B, 712D, 712E, and 712H. Each standoff height H2 between adjacent pairs of dies 700A, 700B, 700C, 700D, and 700E may be the same or different from other standoff heights H2 between other adjacent pairs of dies 700A, 700B, 700C, 700D, and 700E.

In an embodiment, each of the solder regions of the die connectors 728A, 728B, 728C, and 728D are reflowed simultaneously. For example, the dies 700A, 700B, 700C, 700D, and 700E may be aligned, and dielectric-to-dielectric bonds may be formed between adjacent passivation layers 712A, 712B, 712C, 712D, 712E, 712F, 712G, and 712H without reflowing any of the solder regions of the die connectors 728A, 728B, 728C, and 728D. For example, the die connectors 728A, 728B, 728C, and 728D may be in a state similar to that described above with respect to FIG. 1G. After the dies 700A, 700B, 700C, 700D, and 700E are stacked, a single reflow may be performed to simultaneously reflow each of the die connectors 728A, 728B, 728C, and 728D. By performing only one reflow, the number of thermal processes is reduced, and the dies 700A, 700B, 700C, 700D, and 700E are not subjected to multiple reflow processes, reducing the risk of manufacturing defects.

Although FIG. 5 illustrates die connectors in cavities having a similar configuration as FIG. 1H, any of the bonding configurations discussed above may be used. For example, contact pads may be formed on sidewalls and bottom surfaces of the cavities 716A, 716B, 716C, and 716D. The contact pads may (e.g., as illustrated in FIG. 3E) or may not (e.g., as illustrated in FIG. 2C) have conductive needles. Further, although five dies are bonded together in FIG. 5, more or fewer dies may be bonded together in other embodiments.

FIG. 6 illustrates a table of possible cavity (e.g., cavities 716A, 716B, 716C, and 716D) and die connector (e.g., die connectors 728A, 728B, 728C, and 728D) configurations on front sides and back sides of the dies 700A, 700B, 700C, 700D, and 700E prior to bonding according to different embodiments 802, 804, 806, and 808. Other configurations as also possible. For example, in some embodiments, the die connectors 728A, 728B, 728C, and 728D may be formed in respective cavities 716A, 716B, 716C, and 716D (e.g., as described in FIGS. 4A through 4E).

Embodiments discussed herein relate to bond structures for packaged devices. In various embodiments, two or more chips (sometimes referred to as dies) are bonded together using hybrid bonds (a combination of dielectric-to-dielectric bonding and conductor-to-conductor bonding). By employing a hybrid bonding method, a profile of the bonded package may be reduced as the size (e.g., height) of chip connectors are reduced and no underfill needs to be dispensed between the chips after bonding. The omission of an underfill between the chips further allows for lower resistance and lower parasitic capacitance in the bonded package, which improves electrical performance. Further the conductors used in embodiment hybrid bonding processes include solder regions having relatively low reflow temperature. Thus, the conductor-to-conductor bond may be formed at a relatively low temperature, which reduces the risk of damaging any components of the chips. Various embodiments provide mechanisms for bonding chips at relatively low temperature while still providing a low profile for improved reliability and electrical performance.

In accordance with an embodiment, a method comprises patterning a cavity through a first passivation layer of a first package component, the first package component comprising a first semiconductor substrate; and bonding the first package component to a second package component. The second package component comprises a second semiconductor substrate and a second passivation layer. Bonding the first package component to the second package component comprises: directly bonding the first passivation layer to the second passivation layer; and reflowing a solder region of a conductive connector disposed in the cavity to electrically connect the first package component to the second package component. In an embodiment, forming of the conductive connector comprises: forming a seed layer over a first conductive feature in the second passivation layer; forming a first metal layer over the seed layer; forming a second metal layer over the first metal layer; etching the second metal layer; and after etching the second metal layer, forming the solder region over the second metal layer. In an embodiment, etching the second metal layer reduces a surface area of the second metal layer at a surface of the second metal layer opposite the first metal layer. In an embodiment, forming of the seed layer comprises forming a first copper layer using a sputtering process, wherein forming of the second metal layer comprises forming a second copper layer using a plating process, and wherein etching the second metal layer comprises etching the second copper layer at a greater rate than the first copper layer. In an embodiment, the method further includes plating a second conductive feature on sidewalls and a bottom surface of the cavity prior to bonding the first package component to the second package component. In an embodiment, bonding the first package component to the second package component comprises embedding a plurality of conductive needles of the second conductive feature in the solder region. In an embodiment, the method further includes forming the conductive connector in the cavity prior to bonding the first package component to the second package component. In an embodiment, bonding the first package component to the second package component is a flux-less bonding process.

In accordance with an embodiment, a method includes forming a first seed layer on a first passivation layer of a first package component; plating one or more first conductive layers on the first seed layer; forming a solder region on the one or more first conductive layers; and bonding the first package component to a second package component. The second package component comprises a second passivation layer. Bonding the first package component to the second package component comprises: placing the solder region in an opening extending through the second passivation layer, the opening exposes a contact pad of the second package component; directly bonding the first passivation layer to the second passivation layer; and reflowing the solder region to extend the solder region to the contact pad of the second package component. In an embodiment, the one or more first conductive layers comprises a copper layer, and the method further comprises etching the copper layer to reduce a surface area of the copper layer prior to bonding the first package component to the second package component. In an embodiment, the method further includes etching the first seed layer to reduce a width of the first seed layer while etching the copper layer. In an embodiment, the width of the first seed layer is reduced less than the width of the copper layer as a result of etching the copper layer and the first seed layer. In an embodiment, after directly bonding the first passivation layer to the second passivation layer and prior to reflowing the solder region, a gap is disposed between the solder region and the contact pad. In an embodiment, the method further includes forming the contact pad along sidewalls and a bottom surface of the opening. In an embodiment, the method further includes forming a plurality of conductive regions extending upwards from the contact pad, and wherein placing the solder region in the opening comprises embedding at least a portion of the plurality of conductive regions in the solder region.

In accordance with an embodiment, a package includes a first die comprising: a first passivation layer; and a first contact pad; a second die bonded to the first die, the second die comprising: a second passivation layer forming an interface with the first passivation layer; and a second contact pad at a surface of the second passivation layer; a die connector extending through the first passivation layer from the second contact pad to the first contact pad, the die connector comprising: a underbump metallurgy (UBM) comprising a first conductive layer on a second conductive layer, the first conductive layer having a different width than the second conductive layer; and a solder region contacting the first contact pad. In an embodiment, the UBM further comprises a third conductive layer between the first conductive layer and the second conductive layer, the third conductive layer being wider than the first conductive layer and the second conductive layer. In an embodiment, the first contact pad is disposed along sidewalls of the first passivation layer. IN an embodiment, the first contact pad comprises a plurality of conductive regions extending into the solder region. In an embodiment, the first conductive layer is disposed between the second conductive layer and the solder region, and wherein the second conductive layer is wider than the first conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first die comprising a first contact pad and a first insulating bonding layer, wherein an opening extends through the first insulating bonding layer; and
a second die bonded to the first die, the second die comprising a second contact pad in a second insulating bonding layer, wherein the first insulating bonding layer is directly bonded to the second insulating bonding layer, wherein a die connector bonds the first contact pad of the first die to the second contact pad of the second die, and wherein the die connector extends continuously from the first contact pad to the second contact pad, the die connector comprising:
a first metal layer in the opening in the first insulating bonding layer; and
a solder region under the first metal layer and contacting the first contact pad, wherein the first contact pad extends from a level of a bottom surface of the solder region of the die connector to a level of a topmost surface of the die connector in a cross-sectional view, wherein the opening is disposed between a sidewall of the die connector and a sidewall of the first contact pad that faces the die connector.

2. The package of claim 1, wherein the die connector further comprises:
a second metal layer, wherein the first contact pad extends to a same level as a topmost surface of the second metal layer in the cross-sectional view; and
a third metal layer between the first metal layer and the second metal layer, the third metal layer being wider than the first metal layer and the second metal layer.

3. The package of claim 2, wherein the second metal layer is wider than the first metal layer.

4. The package of claim 2, wherein the third metal layer comprises nickel.

5. The package of claim 2, wherein the first metal layer comprises copper, and the second metal layer comprises copper, titanium, or a combination thereof.

6. The package of claim 1, wherein the first contact pad is disposed on sidewalls of the opening.

7. The package of claim 1, wherein the first contact pad comprises a plurality of conductive needles extending into the solder region.

8. A package, comprising:
a first passivation layer comprising an opening extending therethrough;
a second passivation layer directly bonded to the first passivation layer;
a first contact pad in the second passivation layer; and
a die connector in the opening, the die connector bonding the first contact pad to a second contact pad, the die connector comprising:
a first metal layer in the opening;
a second metal layer in the opening, the second metal layer being wider than the first metal layer in a cross-sectional view;
a third metal layer in the opening, the third metal layer being disposed between the first metal layer and the second metal layer, the third metal layer being wider than the second metal layer, and the third metal layer being wider than the first metal layer in the cross-sectional view; and
a solder region contacting the first metal layer, wherein the third metal layer is wider than the solder region in the cross-sectional view.

9. The package of claim 8, wherein the first metal layer has a different material composition than the second metal layer.

10. The package of claim 8, wherein the first metal layer and the third metal layer are made of a same material.

11. The package of claim 8, wherein the second contact pad is disposed along sidewalls and a bottom surface of the opening.

12. The package of claim 8, wherein the second contact pad comprises a plurality of conductive needles extending into the solder region.

13. The package of claim 8, wherein the second contact pad comprises:
a first conductive material layer; and a second conductive material layer on the first conductive material layer, wherein the second conductive material layer is made of a different material than the first conductive material layer.

14. The package of claim 13, wherein the second contact pad further comprises a seed layer, wherein the first conductive material layer is disposed on the seed layer.

15. The package of claim 13, wherein the first conductive material layer comprises nickel, and wherein the second conducive material layer comprises copper.

16. A package comprising:
a first die comprising a first contact pad, the first contact pad lining sidewalls and a bottom surface of an opening in a first passivation layer, the first contact pad comprising a plurality of conductive needles;
a second die comprising a second contact pad in a second passivation layer, the first passivation layer being directly bonded to the second passivation layer; and
a die connector bonding the first contact pad to the second contact pad, the die connector comprising:
a first metal layer in the opening;
a second metal layer in the opening under the first metal layer, the first metal layer being wider than the second metal layer;
a third metal layer between the first metal layer and the second contact pad, the first metal layer being wider than the third metal layer, wherein the first contact pad extends along sidewalls of each of the first metal layer, the second metal layer, and the third metal layer, and wherein Hall the first contact pad extends to a same level as a topmost surface of the third metal layer in a cross-sectional view; and
a solder region under the second metal layer and contacting the first contact pad, wherein the plurality of conductive needles extend into the solder region.

17. The package of claim 16, wherein the third metal layer is wider than the second metal layer.

18. The package of claim 17, wherein the first contact pad further comprises:
a seed layer;
a first conductive material layer on the seed layer; and
a second conductive material layer on the first conductive material layer, wherein the second conductive material layer is made of a different material than the first conductive material layer.

19. The package of claim 18, wherein the second conductive material layer comprises the plurality of conductive needles.

20. The package of claim 16, wherein the first metal layer is wider than a widest point of the solder region in the cross-sectional view.

* * * * *